United States Patent [19]

Sakai

[11] Patent Number: 5,658,700
[45] Date of Patent: Aug. 19, 1997

[54] SEMICONDUCTOR MANUFACTURING APPARATUS HAVING A PLURALITY OF MEASUREMENT DEVICES AND A SEMICONDUCTOR MANUFACTURING METHOD USING THE SAME

[75] Inventor: Toshikazu Sakai, Yokohama, Japan

[73] Assignee: Canon Kabushiki Kaisha, Tokyo, Japan

[21] Appl. No.: 429,093

[22] Filed: Apr. 26, 1995

[30] Foreign Application Priority Data

May 2, 1994 [JP] Japan .................................. 6-113413

[51] Int. Cl.$^6$ .......................... H01L 21/66; H01L 21/68; B65G 49/07
[52] U.S. Cl. .............................. 430/30; 356/358
[58] Field of Search ................................ 430/30; 356/358

[56] References Cited

U.S. PATENT DOCUMENTS

| | | | |
|---|---|---|---|
| 4,261,107 | 4/1981 | Coleman et al. | 33/174 L |
| 4,711,568 | 12/1987 | Torigoe et al. | 355/68 |
| 4,888,536 | 12/1989 | Sakai et al. | 318/592 |
| 5,062,712 | 11/1991 | Sakuta | 356/400 |
| 5,184,055 | 2/1993 | Ohishi et al. | 318/615 |

*Primary Examiner*—Cynthia Hamilton
*Attorney, Agent, or Firm*—Fitzpatrick, Cella, Harper & Scinto

[57] ABSTRACT

An exposure apparatus for manufacturing semiconductors is provided in order to make stages for carrying a wafer compact and to increase their rigidity. The apparatus has an exposure optical system, stages for carrying a wafer, a section for moving the stages relative to the exposure optical system, and first and second measurement sections. The first measurement section measures the positions of the stages, including the positions of the stages when the wafer is exposed to incident radiation. The second measurement means measures at least the positions of the stages at a wafer replacement position, where the first measurement means cannot be used for measurement.

10 Claims, 5 Drawing Sheets

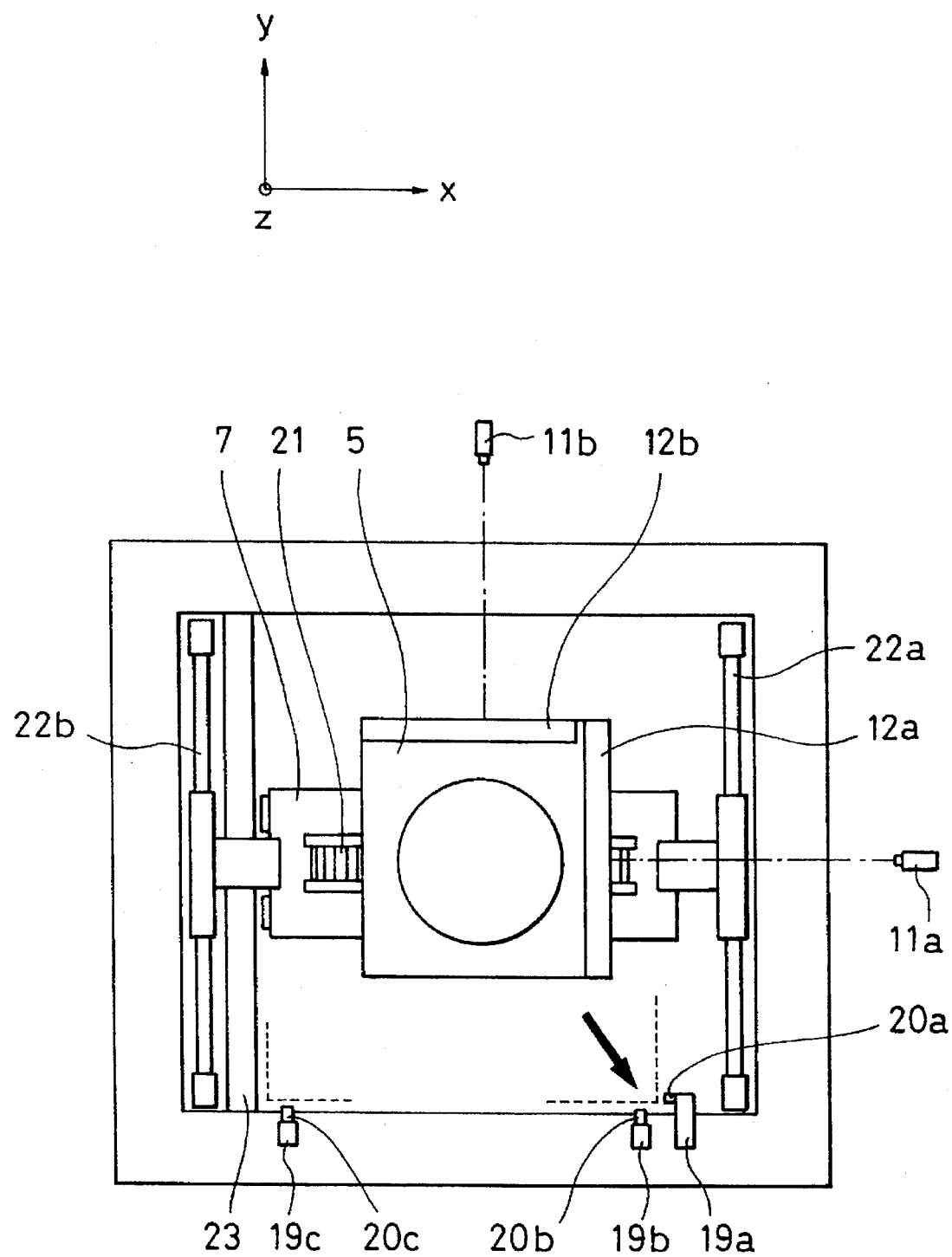

5,658,700

SEMICONDUCTOR MANUFACTURING APPARATUS HAVING A PLURALITY OF MEASUREMENT DEVICES AND A SEMICONDUCTOR MANUFACTURING METHOD USING THE SAME

BACKGROUND OF THE INVENTION

1. Field of the Invention

The present invention relates to a semiconductor manufacturing apparatus and, more particularly, to an exposure apparatus for manufacturing semiconductors comprising an exposure optical system, stages for carrying a wafer, movement means for moving the stages relative to the exposure optical system, and measurement means for measuring the positions of the stages.

2. Description of the Related Art

FIG. 4 is an elevation of the configuration of an exposure apparatus of this type. In FIG. 4, the exposure apparatus comprises an illumination section 1 for illuminating a reticle pattern; a reticle 2 having the pattern to be transferred; a projection lens 3 for projecting the pattern formed on the reticle onto a wafer; a lens-barrel support member 4 for supporting the projection lens 3; a finely adjustable stage 5 for placing the wafer (not shown in the figure), the stage having a function of moving in the Z and θ directions and tilting in directions about the X-Y plane; an X stage 6 for carrying the finely adjustable stage 5 and moving in the X direction; a Y stage 7 for moving in the Y direction; a stage base 8 for supporting the X and Y stages 6 and 7; a surface plate 9 for supporting and securing the stage base 8 placed thereon, the plate being combined with the lens-barrel support member 4; air mounts 10 placed at four locations for supporting the surface plate 9; laser interferometers 11a and 11b (not shown) for measuring the relative position of the projection lens 3 and the finely adjustable stage 5 in the X direction and the Y direction; mirrors 12a and 12b for reflecting laser light emitted from the laser interferometers 11a and 11b; and a light emitting section 13a and light receiving section 13b of a focus detection block for measuring the focus point of the projection lens 3.

The finely adjustable stage 5 is configured as shown in FIGS. 5(a) and 5(b) (sectional view taken on the X-Z plane). There are shown a finely adjustable top plate 16, a guide mechanism 17 for guiding the finely adjustable top plate 16 in the Z direction, a drive mechanism 18 for driving the finely adjustable top plate 16 in the Z direction, such as a stepper motor, and a pin or pins 14 secured on the X stage 6 for transferring a wafer 15.

When a pattern is formed on the wafer 15 with exposure, as shown in FIG. 5(a), the finely adjustable top plate 16 is driven such that the upper end of the finely adjustable top plate 16 is positioned higher than that of the pins 14. The wafer 15 is exposed to light while it is being held on the finely adjustable top plate 16. When the wafer 15 is transferred to a hand (not shown in the figure), the finely adjustable top plate 16 is driven such that the upper end of the finely adjustable top plate 16 is positioned lower than that of the pins 14, as shown in FIG. 5(b). The apparatus is configured such that the wafer 15 can be transferred to the hand (not shown) by lifting the wafer 15 with the pins 14.

The mirrors 12a and 12b for measuring the positions of the X and Y stages 6 and 7 are extended in the Z direction so that laser light beams emitted from the laser interferometers 11a and 11b are reflected even when the finely adjustable stage 5 lifts or lowers for transferring the wafer. The apparatus is also configured such that the mirrors 12a and 12b do not touch the projection lens 3 even when the X and Y stages 6 and 7 move in the entire operating area.

In the apparatus described above, however, because the mirrors 12a and 12b are placed such that the mirrors 12a and 12b do not touch a lens system and the mirrors 12a and 12b can reflect the lasers emitted from the laser interferometers 11a and 11b for positional measurement even when the finely adjustable mechanism of the finely adjustable stage 5 moves up and down for transferring the wafer, the mirrors 12a and 12b are extended in the Z direction and the finely adjustable mechanism of the finely adjustable stage 5 becomes large in the X and Y directions. Therefore, the apparatus has several drawbacks of having the large finely adjustable stage becoming bulky with a waste of space, requiring a long positioning time due to vibration caused by low rigidity of the finely adjustable stage, and others.

SUMMARY OF THE INVENTION

Accordingly, objects of the present invention include making stages for carrying a wafer compact and increasing the rigidity of the stages in a semiconductor manufacturing apparatus.

According to a first aspect of the present invention, a semiconductor exposure apparatus for exposing a wafer includes an exposure optical system for exposing the wafer to incident radiation, a plurality of stages for carrying the wafer, movement means for moving each of the plurality of stages relative to the exposure optical system, and first and second measurement means. The first measurement means is for measuring the position of each of the plurality of stages including the position of each of the plurality of stages when the wafer is exposed by the exposure optical system. The second measurement means is for measuring the position of each of the pluarlity of stages when the stages are located at a replacement position of the wafer, the replacement position being a position not able to be measured by the first measurement means.

According to another aspect of the present invention, a semiconductor manufacturing apparatus includes a holder for holding a wafer, movement means for moving the holder between a wafer exposure position and a wafer replacement position, a mirror that moves in conjunction with the holder, drive means for driving the holder at the wafer replacement position in a direction different from the direction in which the movement means moves the holder, and first and second measurement means. The first measurement means is for emitting light beams and for measuring the position of the holder by using a light beam emitted towards and reflected from the mirror. The second measurement means is for measuring the position of the holder when a light beam emitted by the first measurement means is not reflected from the mirror due to movement of the holder by the drive means.

According to yet another aspect of the present invention, a semiconductor manufacturing method includes the steps of moving a holder holding a wafer from a wafer replacement position towards a wafer exposure position using movement means, measuring the position of the holder with first measurement means that emits a light beam towards a mirror moving in conjunction with the holder and uses light reflected from the mirror for measurement while the movement means is moving the holder from the wafer replacement position towards the wafer exposure position, exposing the wafer on the holder positioned at the wafer exposure position, and moving the holder from the wafer exposure position towards the wafer replacement position with the movement means. The method further includes the steps of measuring the position of the holder with the first measurement means while the movement means is moving the holder from the wafer exposure position towards the wafer replacement position, moving the holder with drive means at the wafer replacement position in a direction different from the direction in which the movement means moves the holder, and measuring the position of the holder with second measurement means when the first measurement means is ineffective due to movement of the holder by the drive means at the wafer replacement position.

The arrangement may be as follows. The above-described stages include X and Y stages which can move, respectively, in X and Y directions perpendicular to an exposure optical axis, and a finely adjustable stage thereon which can move finely at least in a Z direction. The above-described movement means moves the X and Y stages and the finely adjustable stage in the X, Y, and Z directions, respectively. The first measurement means comprises laser length-measuring machines which can measure positions using long strokes. The finely adjustable stage is equipped with mirror surfaces which are placed perpendicular to the X and Y directions for positional measurement by the laser length-measuring machines and which move in conjunction with the finely adjustable stage. The second measurement means comprises sensors which can measure the X and Y coordinates of the stages using short strokes. The first measurement means cannot be used for measurement when the X and Y stages are located at a position where the wafer is replaced and when the finely adjustable stage is lowered by the movement means in the Z direction for replacement of the wafer. In this case, a control system switches control by measurement with the first measurement means and control by measurement using the second measurement means before and after a period when the first measurement means cannot be used for measurement, and the reference position of the first measurement means is set before control by measurement with the second measurement means is switched to control by measurement with the first measurement means.

Since the apparatus described above has the second measurement means for measuring at least the position of the stages when the stages are located at the wafer replacement position where the first measurement means cannot be used for measurement, the role of the first measurement means is facilitated and the configuration of the first measurement means is made compact, enabling the apparatus to be configured reasonably and improving its rigidity. Particularly when laser length-measuring machines with long strokes are used as the first measurement means, even if a laser light beam emitted by the length-measuring machines is not reflected from a mirror because the mirror has insufficient height, positioning control of the stage is smoothly performed by switching to measurement with the second measurement means. This enables small mirrors to be used, making the apparatus compact by the space required for the mirrors and increasing its rigidity. Accordingly, the time required for positioning is also reduced.

BRIEF DESCRIPTION OF THE DRAWINGS

FIG. 2 is a plan view of the apparatus shown in FIG. 1.

DETAILED DESCRIPTION OF THE PREFERRED EMBODIMENTS

Figure 1:
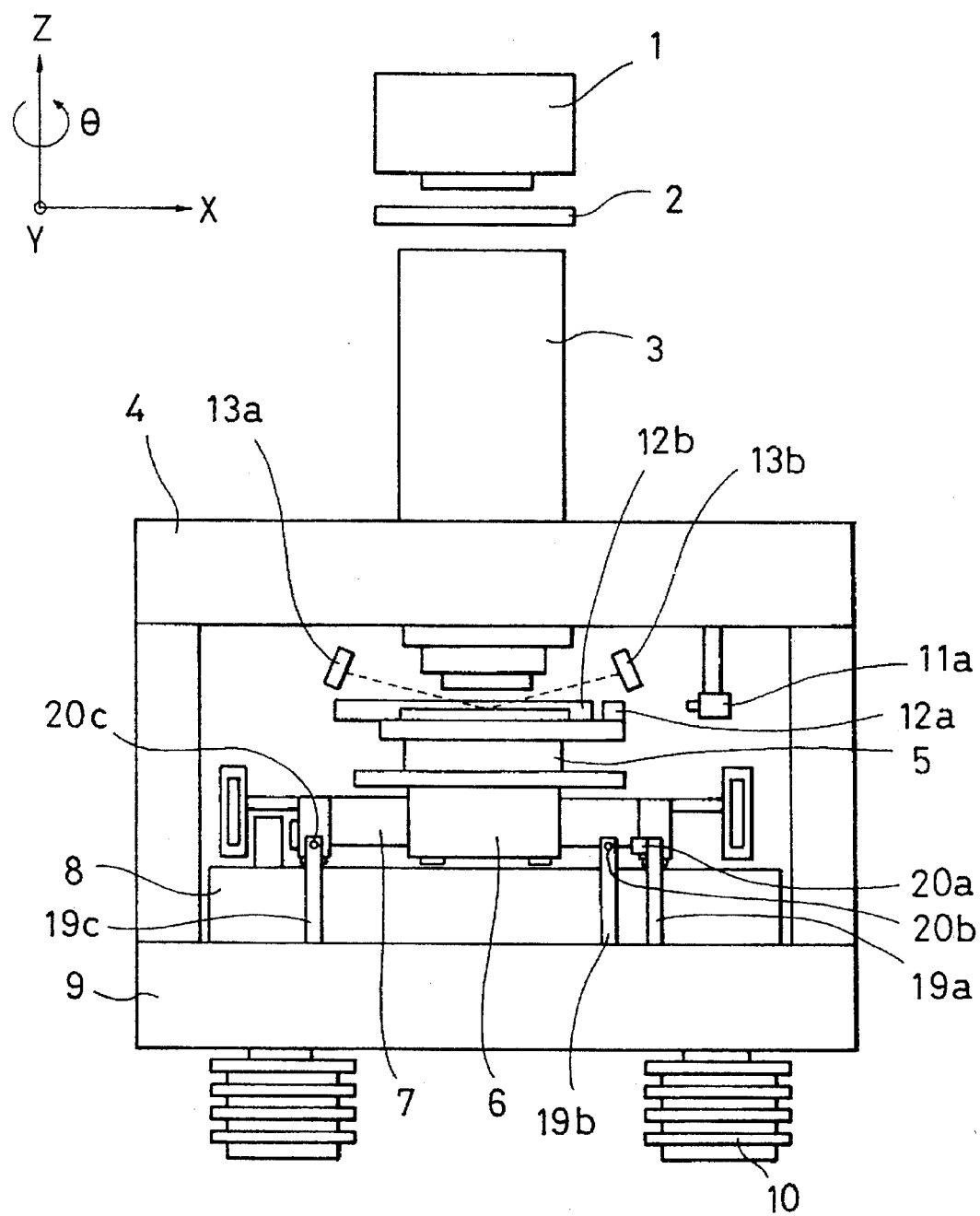
FIG. 1 is an elevation of a semiconductor exposure apparatus according to an embodiment of the present invention.
Figure 3A:
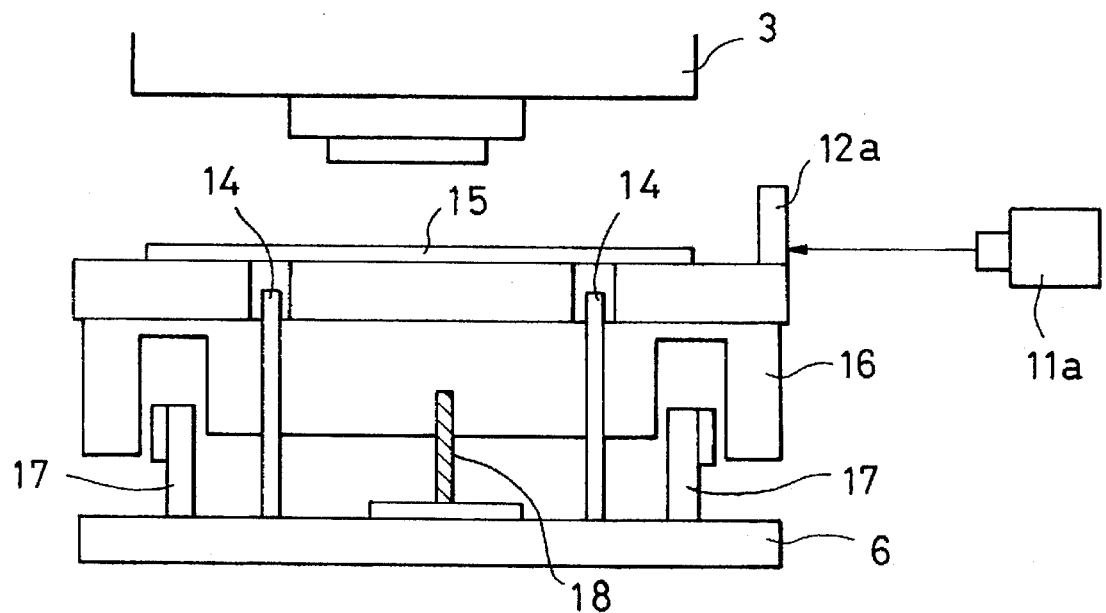
FIGS. 3(a) and 3(b) are sectional views illustrating an operation of a finely adjustable table section of the apparatus shown in FIG. 1.
Figure 3B:
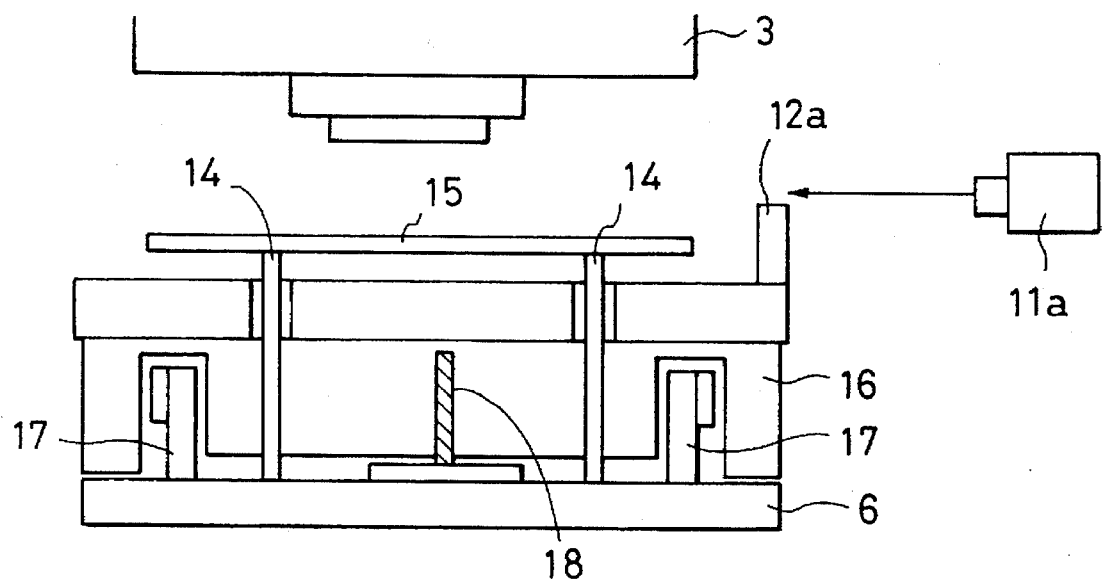
Figure 4:
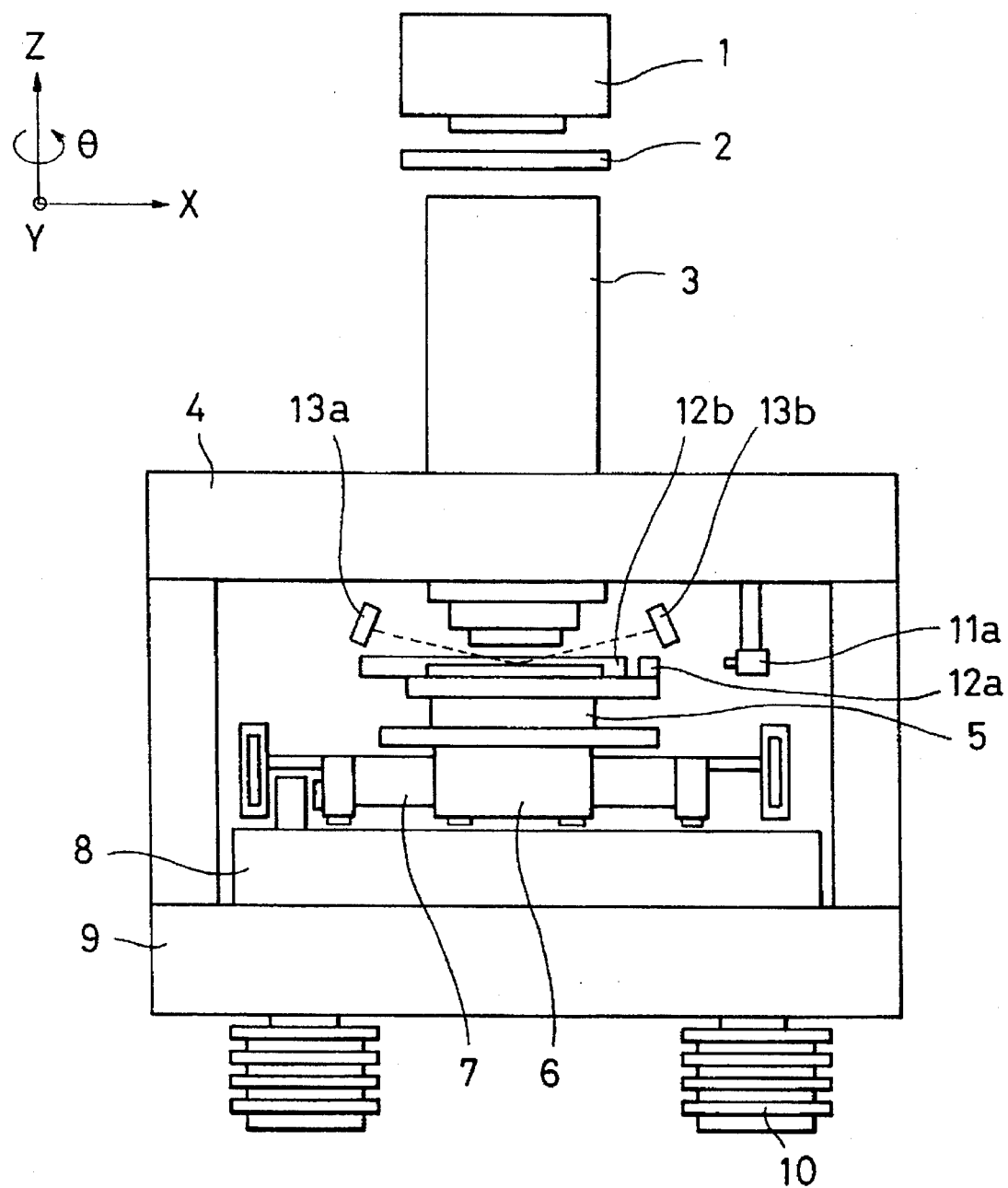
FIG. 4 is an elevation of a comparative semiconductor exposure apparatus.
Figure 5A:
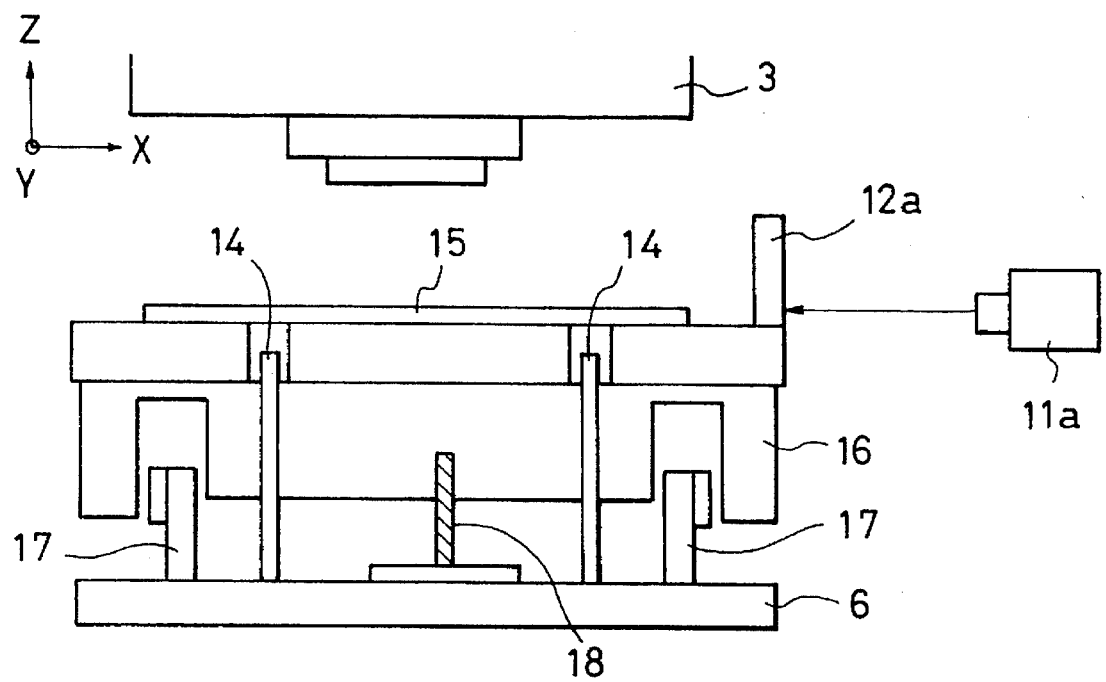
FIGS. 5(a) and 5(b) are sectional views illustrating an operation of a finely adjustable table section of the apparatus shown in FIG. 4.
Figure 5B:
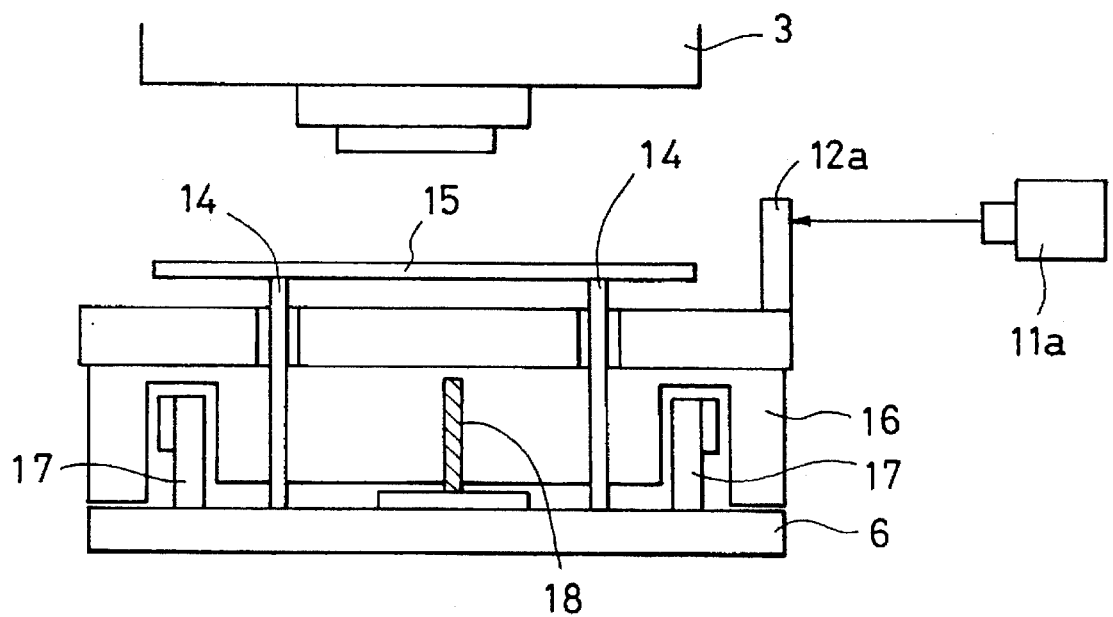

FIG. 1 is an elevation of a semiconductor exposure apparatus according to an embodiment of the present invention. FIG. 2 is a plan view of the apparatus shown in FIG. 1. FIGS. 3(a) and 3(b) are sectional views of a finely adjustable stage section of the apparatus shown in FIG. 1. The same reference characters designate the same portions in FIG. 1 and FIG. 4. In FIGS. 1 through 3(b), there are shown sensors 20a, 20b, and 20c with short strokes, such as electrostatic sensors and eddy-current sensors, mounts 19a, 19b, and 19c for holding the sensors 20a, 20b, and 20c against a surface plate 9, a linear motor 21 for driving an X stage 6 in the X direction, linear motors 22a and 22b for driving a Y stage 7 in the Y direction, and a Y guide 23 for guiding the Y stage 7 in the Y direction. The Y stage 7 is driven in the Y direction by the Y linear motors 22a and 22b along the Y guide 23. The X stage 6 is driven in the X direction by the X linear motor 21 along the side face of the Y stage 7, which serves as an X guide.

When a pattern is formed on a wafer with exposure to incident radiation, the X and Y stages 6 and 7 are positioned with laser length-measuring machines with long strokes, namely, a laser interferometer 11a for positioning in the X direction and a laser interferometer 11b for positioning in the Y direction. As shown in FIG. 3(a), the finely adjustable stage 5 is moved such that the upper end of a finely adjustable top plate 16 is located higher than that of a pin 14. A wafer 15 is exposed to incident radiation while it is being held on the finely adjustable top plate 16. When the wafer is to be transferred to a hand, the X and Y stages are moved in the X direction and Y direction, respectively, using the laser interferometers 11a and 11b with long strokes to a replacement position where the wafer is transferred, such that the finely adjustable stage 5 is located at the position shown by a dotted line in FIG. 2. The sensors for measuring positions are switched from the laser interferometers 11a and 11b to sensors 20a, 20b, and 20c (having a maximum measurement range of several millimeters and a positional resolution nearly the same as that of the laser interferometers) with short strokes, such as electrostatic sensors and eddy-current sensors. The X and Y stages 6 and 7, and the finely adjustable stage 5 are positioned so as not to move in the X, Y, and θ directions. The sensors are switched in the following way. While the stages are being positioned in accordance with measurements from the laser length-measuring machines using a control system (not shown), the positions of the sensors with short strokes are measured. Then, positioning control with the laser length-measuring machines is stopped and positioning using the control system (not shown) is performed with the sensors having short strokes. Positioning is performed at the place where the position thereof is measured with the sensors having short strokes before the sensors are switched. After positioning, the wafer 15 is transferred with the finely adjustable top plate 16 being lowered, as shown in FIG. 3(b). The lasers for long-distance measurement pass over mirrors 12a and 12b, disabling the laser length-measuring machines to be used for position measurement. After another wafer is transferred to the pins 14 with a hand (not shown in the figure), the finely adjustable top plate 16 is lifted again, as shown in FIG. 3(a). Then, light beams of the lasers emitted towards the mirrors 12a and 12b are reflected by the mirrors 12a and 12b and interference takes place, enabling the laser length-measuring machines to measure the position of the finely adjustable stage 5. Since these laser interferometers cannot return to the positions where they were located when they were disabled, it is necessary for the laser length-measuring machines to return to predetermined reference positions before a pattern is printed on a wafer. Each time a wafer is replaced, the laser length-measuring machines return surely to the reference positions within the measurement area of the sensors having short strokes. Specifically, the X and Y stages are moved to a determined reference point within the measurement area of the sensors having short strokes, then the reference positions of the laser length-measuring machines are reset. Positioning control with the sensors having short strokes is switched to that using lasers, and exposure is performed. Specifically, the sensors are switched in the following way. Stage positioning control using the sensors with short strokes is stopped, then positioning control using the laser length-measuring machines starts.

In the above-described embodiment, the sensors having short strokes are used for the reference-position return of the laser length-measuring machines. Switches for reference-position return may be provided separately.

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A semiconductor exposure apparatus for exposing a wafer, said semiconductor exposure apparatus comprising:

an exposure optical system for exposing the wafer to incident radiation;

a plurality of stages for carrying a wafer, said plurality of stages comprising X and Y stages that can move in an X direction and a Y direction, respectively, the X direction and the Y direction being perpendicular to an exposure optical axis of said exposure optical system, and a finely adjustable stage disposed thereon that can move finely at least in a Z direction;

movement means for moving each of said plurality of stages relative to said exposure optical system;

first measurement means for measuring the positions of each of said plurality of stages, including the position of each of said plurality of stages when the wafer is exposed by said exposure optical system, said first measurement means comprising laser length-measuring machines for measuring positions with long strokes, wherein said first measurement means is ineffective for measurement when said X and Y stages are located at a replacement position of the wafer and said finely adjustable stage lowers in the Z direction for wafer replacement; and second measurement means for measuring the position of each of said plurality of stages when said stages are located at the replacement position of the wafer, and said finely adjustable stage lowers in the Z direction for wafer replacement, said second measurement means comprising sensors for measuring the X and Y coordinates of each of said plurality of stages with short strokes.

2. An apparatus according to claim 1, wherein said movement means moves said X stage, said Y stage, and said finely adjustable stage in the X, Y, and Z directions, respectively; and said finely adjustable stage comprises mirror surfaces disposed perpendicularly to the X and Y directions for positional measurement by said laser length-measuring machines.

3. An apparatus according to claim 2, further comprising means for switching position control using position measurement by said first measurement means and position control using position measurement by said second measurement means before and after a period when said first measurement means is ineffective for measurement, and means for setting a reference position of said first measurement means before said switching means switches position control from using position measurement by said second measurement means to using position measurement by said first measurement means.

4. An apparatus according to claim 1, wherein said second measurement means comprises one of an electrostatic sensor and an eddy-current sensor.

5. An apparatus according to claim 1, wherein said second measurement means comprises a plurality of measurement sensors.

6. A semiconductor exposure method for exposing a wafer, said semiconductor exposure method comprising:

exposing the wafer to incident radiation using an exposure optical system;

providing a plurality of stages for carrying a wafer, the plurality of stages comprising X and Y stages that can move in an X direction and a Y direction, respectively, the X direction and the Y direction being perpendicular to an exposure optical axis of the exposure optical system, and a finely adjustable stage disposed thereon that can move finely at least in a Z direction;

moving each of the plurality of stages relative to the exposure optical system using movement means;

measuring, using first measurement means, the positions of each of the plurality of stages, including the position of each of the plurality of stages when the wafer is exposed by the exposure optical system, the first measurement means comprising laser length-measuring machines for measuring positions with long strokes, wherein the first measurement means is ineffective for measurement when the X and Y stages are located at a replacement position of the wafer and the finely adjustable stage lowers in the Z direction for wafer replacement; and measuring, using second measurement means, the position of each of the plurality of stages when the stages are located at the replacement position of the wafer, and the finely adjustable stage lowers in the Z direction for wafer replacement, the second measurement means comprising sensors for measuring the X and Y coordinates of each of the plurality of stages with short strokes.

7. A method according to claim 6, further comprising moving, using the movement means, the X stage, the Y stage, and the finely adjustable stage in the X, Y, and Z directions, respectively, and wherein the finely adjustable stage comprises mirror surfaces disposed perpendicularly to the X and Y directions for positional measurement by the laser length-measuring machines.

8. A method according to claim 7, further comprising switching position control using position measurement by the first measurement means and position control using position measurement by the second measurement means before and after a period when the first measurement means is ineffective for measurement, and setting a reference position of the first measurement means before said switching step switches position control from using position measurement by the second measurement means to using position measurement by the first measurement means.

9. A method according to claim 6, wherein the second measurement means comprises one of an electrostatic sensor and an eddy-current sensor.

10. A method according to claim 6, wherein the second measurement means comprises a plurality of measurement sensors.

* * * * *

UNITED STATES PATENT AND TRADEMARK OFFICE
CERTIFICATE OF CORRECTION

PATENT NO.    : 5,658,700
DATED         : August 19, 1997
INVENTOR(S)   : TOSHIKAZU SAKAI It is certified that error appears in the above-indentified patent and that said Letters Patent is hereby corrected as shown below:

ON THE COVER PAGE:

Under "References Cited", item [56]

U.S. PATENT DOCUMENTS

The following should be inserted:  --4,770,531 9/1988  Tanaka et al.--

COLUMN 2

Line 32, "stages" should read --stages,--.

Signed and Sealed this

Tenth Day of March, 1998

Attest:

BRUCE LEHMAN

Attesting Officer     Commissioner of Patents and Trademarks